(12) United States Patent
Beneitez et al.

(10) Patent No.: US 8,704,259 B2
(45) Date of Patent: Apr. 22, 2014

(54) OPTICAL ILLUMINATION DEVICE

(75) Inventors: Alberto Gejo Beneitez, Aldeamayor de San Martin (ES); Iñigo Alvarez Ximenez de Embun, Aldeamayor de San Martin (ES); Moisés Domingo García, Aldeamayor de San Martin (ES)

(73) Assignee: Luxintec, S.L., Aldeamayor de San Martin (Valladolid) (ES)

( * ) Notice: Subject to any disclaimer, the term of this patent is extended or adjusted under 35 U.S.C. 154(b) by 55 days.

(21) Appl. No.: 13/497,808

(22) PCT Filed: Sep. 25, 2009

(86) PCT No.: PCT/ES2009/070403
§ 371 (c)(1),
(2), (4) Date: Jun. 14, 2012

(87) PCT Pub. No.: WO2011/036311
PCT Pub. Date: Mar. 31, 2011

(65) Prior Publication Data
US 2012/0241777 A1    Sep. 27, 2012

(51) Int. Cl.
*H01L 33/00* (2010.01)
*H01L 33/58* (2010.01)
*H01L 25/075* (2006.01)

(52) U.S. Cl.
CPC ............ *H01L 33/58* (2013.01); *H01L 25/075* (2013.01)
USPC ......... 257/98; 257/E33.067; 362/256; 438/27

(58) Field of Classification Search
USPC ............. 257/98, E33.067, E33.068; 362/255, 362/256, 294; 438/27, 29
See application file for complete search history.

(56) References Cited

U.S. PATENT DOCUMENTS

| 5,857,767 | A | 1/1999 | Hochstein |
| 6,402,347 | B1 * | 6/2002 | Maas et al. ................... 362/294 |
| 7,153,000 | B2 * | 12/2006 | Park et al. ..................... 362/268 |
| 7,344,902 | B2 * | 3/2008 | Basin et al. ..................... 438/27 |
| 7,547,115 | B2 * | 6/2009 | Chou ............................. 362/244 |
| 2001/0007527 | A1 | 7/2001 | Lammers et al. |
| 2005/0051785 | A1 * | 3/2005 | Erchak et al. .................. 257/98 |
| 2005/0174771 | A1 | 8/2005 | Conner |
| 2006/0105485 | A1 * | 5/2006 | Basin et al. ..................... 438/27 |
| 2010/0006877 | A1 * | 1/2010 | Chen ............................... 257/98 |
| 2010/0038663 | A1 * | 2/2010 | Benitez et al. .................. 257/98 |

FOREIGN PATENT DOCUMENTS

| ES | 2197498 | 1/2004 |
| ES | 1066568 | 2/2008 |
| WO | 2009015605 | 2/2009 |

OTHER PUBLICATIONS

International Search Report of the International Searching Authority dated May 26, 2010 from the corresponding PCT/ES2009/070403.

* cited by examiner

*Primary Examiner* — Allan R Wilson
(74) *Attorney, Agent, or Firm* — Gary J. Gershik; Cooper & Dunham LLP

(57) ABSTRACT

The present invention relates to an optical lighting device comprising at least one light emitting diode configured for emitting said light with a trajectory, the device being capable of modifying said trajectory since it comprises an optical element comprising two faces each having a plurality of preferably rectangular lenses, each lens of one face being aligned with a lens of the other face.

3 Claims, 4 Drawing Sheets

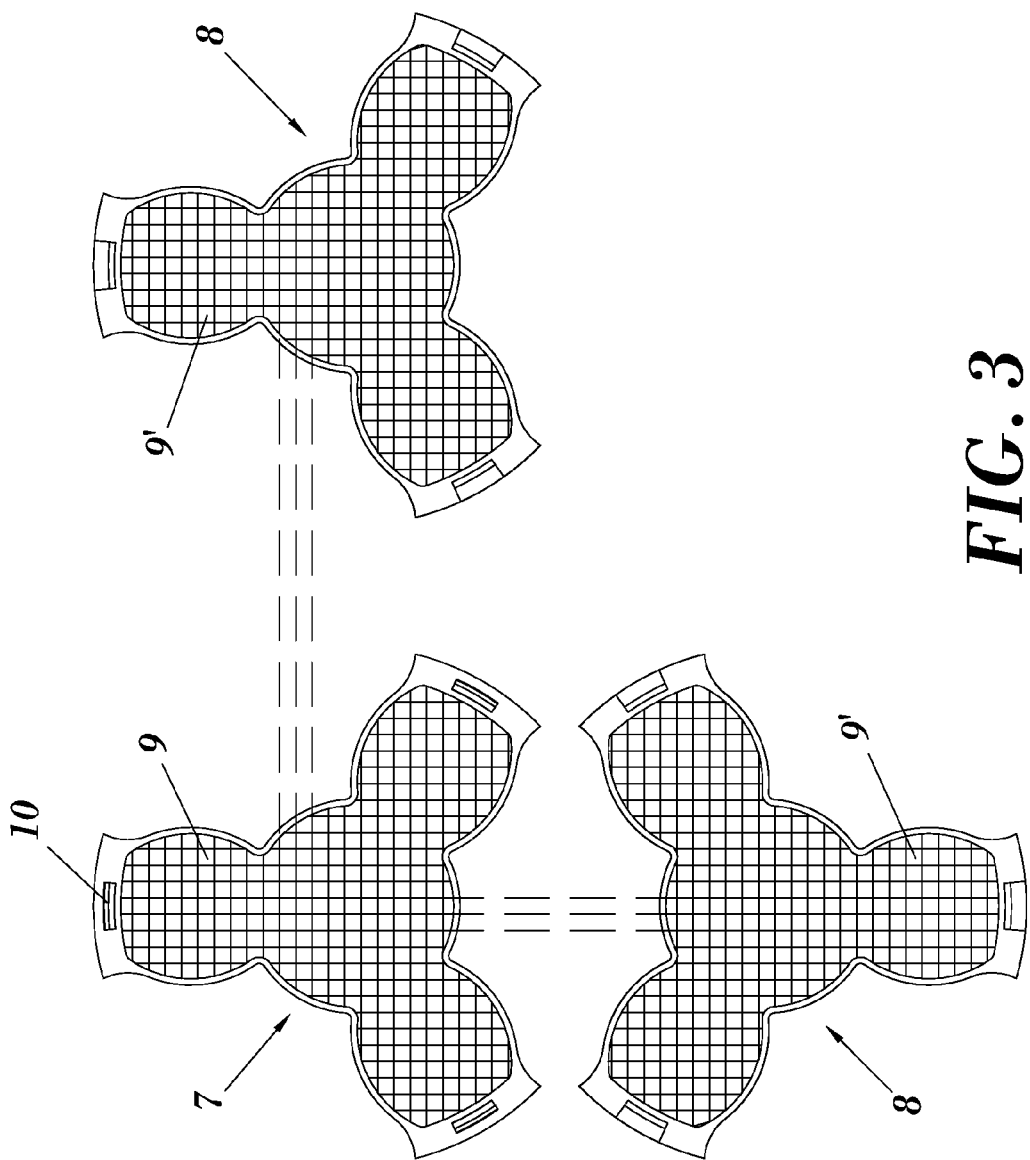

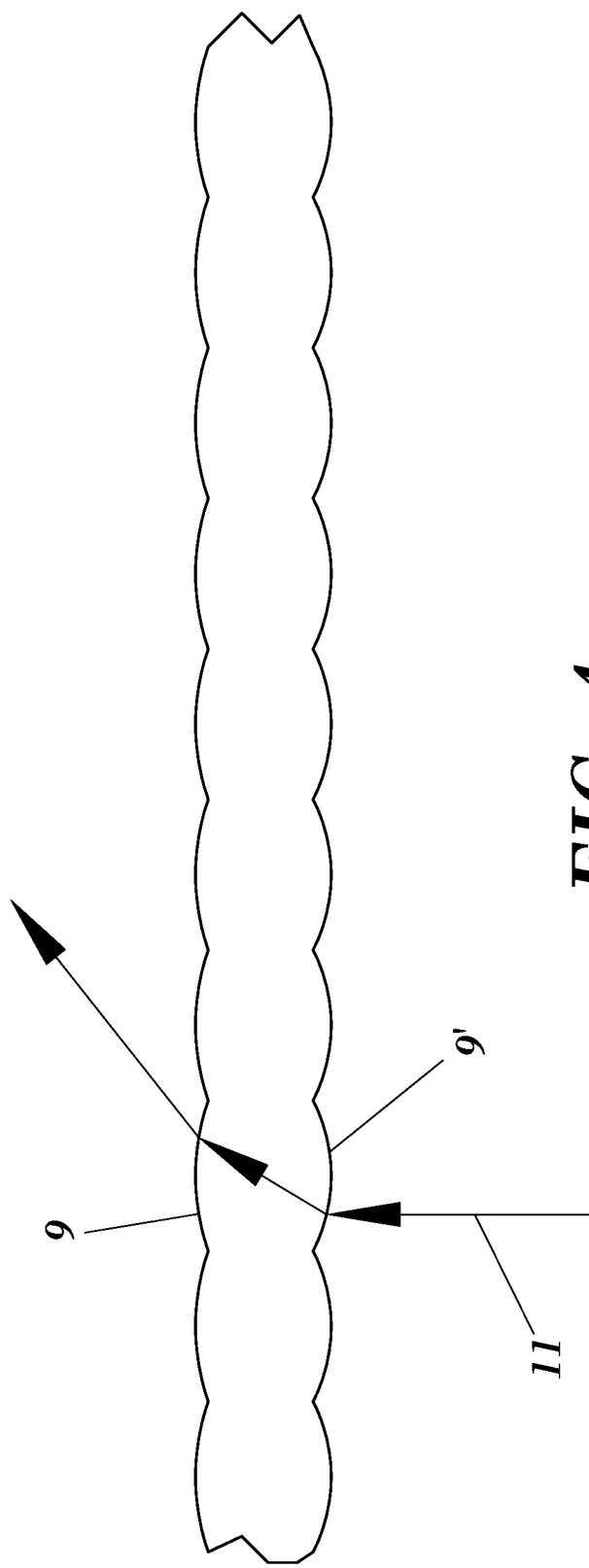

OPTICAL ILLUMINATION DEVICE

FIELD OF THE INVENTION

The present invention applies to the field of lighting and more specifically to an optical lighting device based on LEDs.

BACKGROUND OF THE INVENTION

The use of light emitting diodes (LED) as part of lighting devices, such as lamps, torches, signalling elements, etc., is known. In many of these applications, LEDs have taken over from other lighting alternatives, due, among others, to great reliability, lighting efficiency, and ease of integration due to size and efficiency.

In these lighting devices with LEDs, there is often a structure in which one or more LEDs are connected or integrated to a support, for example a printed circuit board (PCB), on which there are included one or more optical elements acting on the light emitted by the LEDs (for example, combining it with the light of other LEDs by means of lenses) or serving as protection (for example, layers of plastic materials).

For example, ES 1 066 568 U presents an optical light emitting system based on LEDs suitable for beacons of navigation aid systems, with a large requirement for energy efficiency. To adapt to this requirement, the system includes a Fresnel lens cylindrically symmetrical with respect to the focal axis of the lens, in addition to other geometric characteristics detailed in the specification. This lens collects the light emitted by the LEDs and forms a narrow beam of light vertically (between 3° and)8°, while covering 120° horizontally.

Another application is presented in ES 2 197 498 T3, in this case for luminous signalling in the railway environment. In addition to combining a high number of diodes to achieve the necessary luminous intensity, the device specifically has a side lens which allows checking its correct operation.

However, there is still the need for lighting devices based on LEDs optimising the lighting efficiency thereof both in terms of light transmission within the device itself and in terms of adaptation of the light emitted to the specific scenario in which the device is located, such as for example, in long and narrow areas such as corridors or square areas.

SUMMARY OF THE INVENTION

The present invention solves the aforementioned problem by means of an optical lighting device based on LEDS generating light which when projected on a flat surface has specific geometric shapes. This emitting pattern is achieved by means of at least one LED emitting light with a trajectory, this trajectory being modified by means of an optical element with two faces, each having a plurality of lenses (also referred to as mini lenses throughout the present specification, since they are smaller than or equal in size to the size of the LED) the base of which preferably has a substantially rectangular shape. Obviously, the expression "substantially rectangular" aims to encompass square shapes, as they are regular rectangles, as well as small variations on said shapes, such as for example rectangles with rounded edges or with slight deformations or imperfections.

The mini lenses of each face are aligned one-to-one, i.e., each mini lens of the first face is aligned with a mini lens of the second face, aligned being understood as the projection of the base of the mini lens substantially coinciding with the base of the mini lens of the second face.

Light thus modifies its trajectory when passing through the optical element, forming a square or rectangular beam at the outlet with an aperture or scattering of the beam depending on the superficial shape of the mini lenses.

In addition to controlling the distribution of light at the outlet, the use of lenses on both faces of the optical element allows optimising light transmission and therefore optimising the energy efficiency of the system.

These and other aspects of the invention will become apparent from the embodiments described below in the present specification.

BRIEF DESCRIPTION OF THE DRAWINGS

In order to aid in better understanding the features of the invention according to a preferred practical embodiment thereof and to complement this description a set of drawings the character of which is illustrative and non-limiting is attached as an integral part thereof:

FIG. 3 shows upper and lower views of the optical element with mini lenses.

FIG. 4 shows a side cross section of the optical element with mini lenses as well as the effect thereof on a beam of light.

DETAILED DESCRIPTION OF THE INVENTION

In this text, the term "comprises" and its derivatives (such as "comprising", etc.) must not be understood as excluding, i.e., these terms must not be interpreted as excluding the possibility that what has been described and defined could include more elements, steps, etc.

Figure 1:
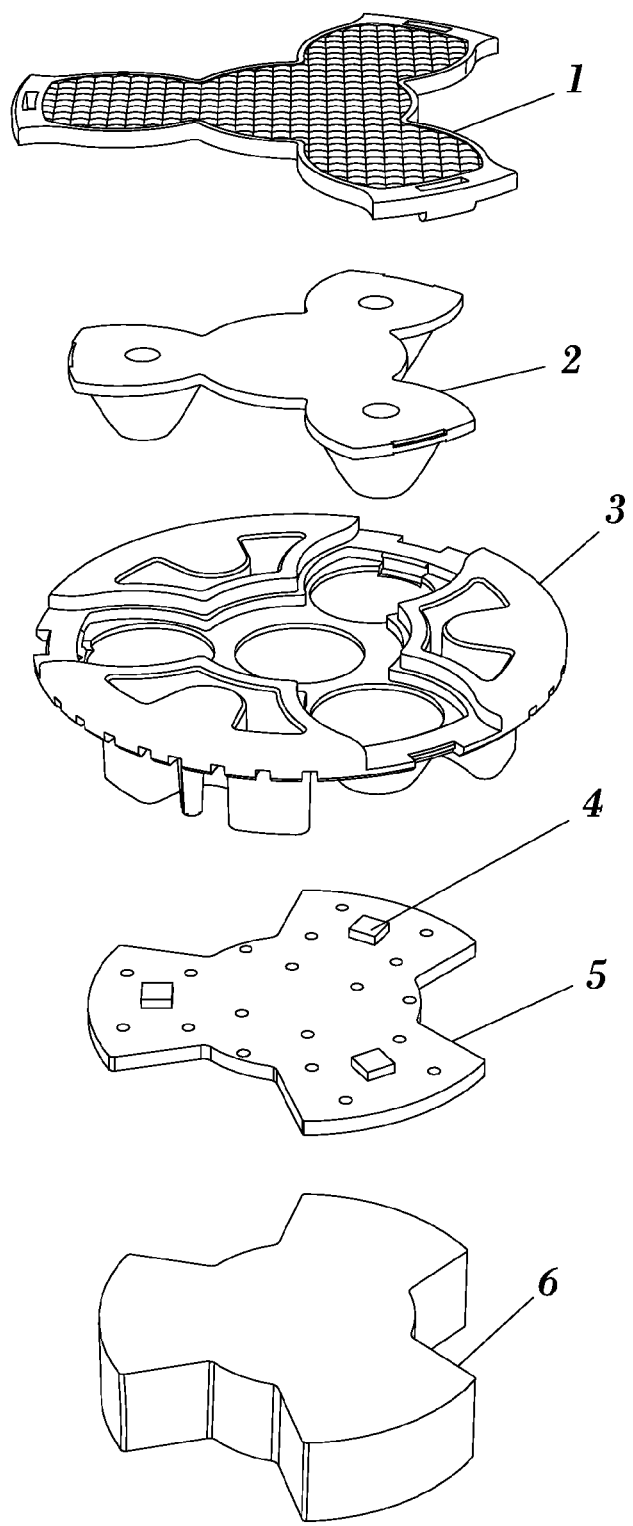
FIG. 1 shows a perspective view of the elements forming the device object of the invention.

FIG. 1 shows the parts or elements forming an optical lighting device according to a preferred embodiment of the present invention. Said elements are represented separately for illustrative purposes, needing to be coupled (in the same order in which they are presented in said figure) to operate correctly.

The example of FIG. 1 has three LEDs 4 integrated in a printed circuit board 5, said LEDs 4 forming an equilateral triangle structure. Nevertheless, both the number of LEDs and the distribution thereof can be modified without departing from the scope of the present invention as a result.

The printed circuit board 5 is in contact with a heat diffusing element preventing overheating problems.

In the example, two optical elements are located in the trajectory of the light emitted by the LEDs 4, consequently modifying said trajectory. Nevertheless, it is contemplated that the device can contain another number of optical elements maintaining its functionality. The first optical element 1 collects the light impinging on it and modifies its trajectory, as detailed below, such that said light has a square or rectangular shape when it is projected on a flat surface. The second optical element 2 has the function of directing the light of the LEDs 4 to the first optical element 1, said second optical element 2 being manufactured in transparent plastic material to that end.

According to an alternative nomenclature depending on its proximity to the LEDs 4, the first optical element 1 can in this case be referred to as "secondary optic", and the second optical element 2, "primary optic".

The device additionally comprises a support element 3 for the primary optic which has holes for ventilation by convection, and the shape of which adapts to that of the printed circuit board 5 and to that of the distributing element 6 for the purpose of ventilating both. Furthermore, according to a preferred embodiment, the support element 3 is manufactured in white plastic or metallised plastic to reflect all the light it receives through successive reflections towards the primary and secondary optics, such that the complete system makes maximum use of the light emitted by the LEDs.

Figure 2:
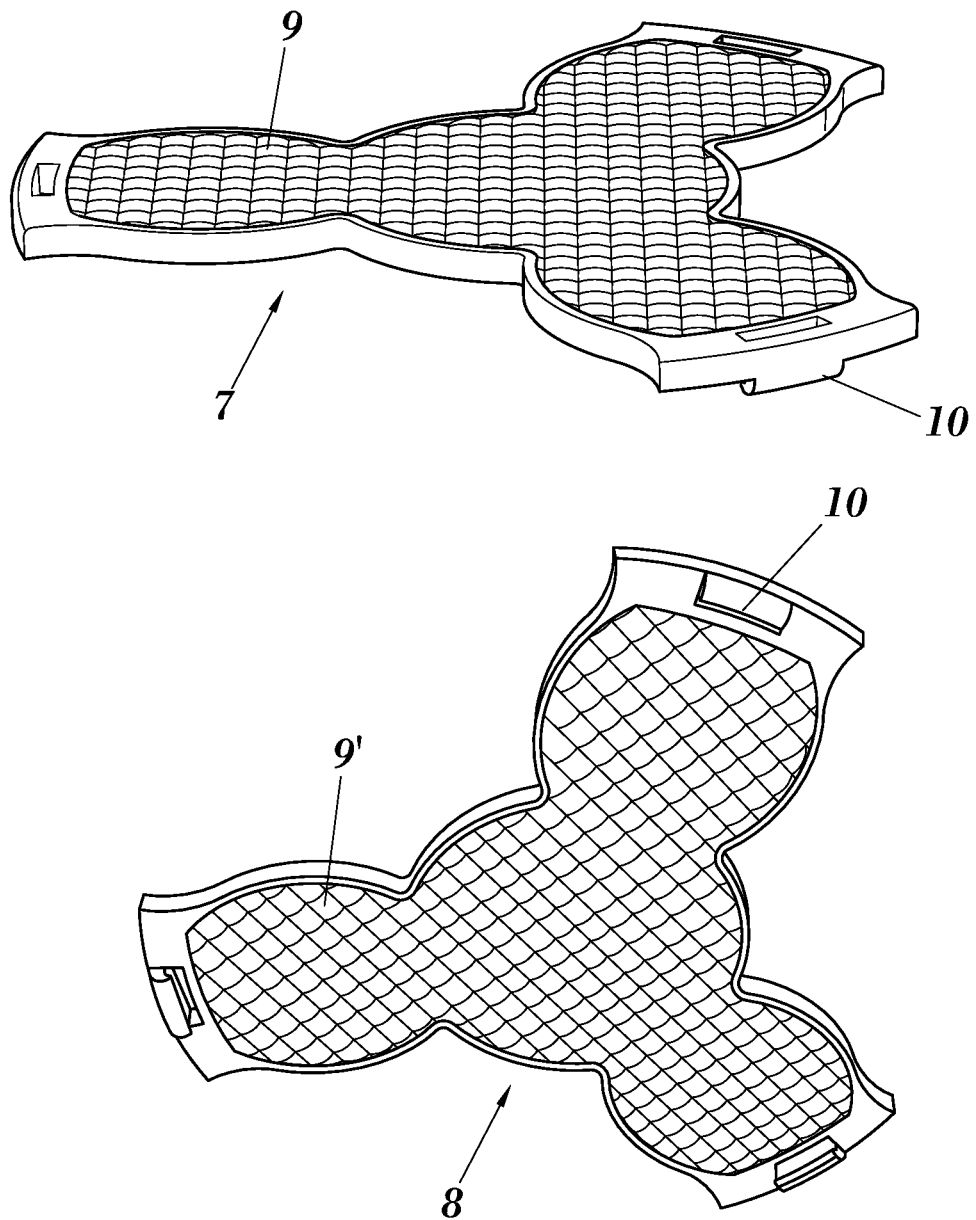
FIG. 2 shows a perspective view of the optical element with mini lenses in greater detail.

FIG. 2 shows two perspective views of the first optical element 1 (or secondary optic) while FIG. 3 shows the same element by means of its upper and lower view (said lower view being projected to the right and downwards). FIG. 4 shows a transverse cross section of the secondary optic 1 as well as the effect of said secondary optic 1 on a beam of light 11.

The secondary optic comprises a first face 7 or upper face and a second face 8 or lower face, each being covered with mini lenses 9-9'. Said mini lenses are smaller than or equal in size to the LEDs 4, preferably covering the entire surface of the secondary optic which the light of said LEDs 4 reaches. The secondary optic is coupled to the rest of the elements of the device by coupling means 10, in this case, by securing to the support element 3 of the primary optic.

Each mini lens of the upper face 9 is aligned with a mini lens of the lower face 9', such that the projections of their bases coincide. Said bases have a rectangular shape, consequently modifying the trajectory of the beams of light 11 impinging on the mini lenses of the lower face 9', exiting through the mini lenses of the upper face 9', such that the light finally emitted by the device as a whole has a rectangular shape when projected on a flat surface, while at the same time light transmission and therefore the lighting efficiency of the system are maximized.

In view of the description and figures, the person skilled in the art will be able understand that the invention has been described according to several preferred embodiments thereof, but that multiple variations can be introduced in said preferred embodiments without departing from the object of the invention as it has been claimed.

The invention claimed is:

1. Optical lighting device comprising at least one light emitting diode (4) configured for emitting said light with a trajectory, characterized in that it further comprises a first optical element (1) comprising:
   a first face (7) with a plurality of lenses;
   a second face (8) with a plurality of lenses, where each lens of the second face (9') is aligned with a lens of the first face (9);
   a second optical element (2) configured for directing the light emitted by the at least one light emitting diode (4) to the first optical element (1); and
   a support element (3) for the second optical element comprising holes for ventilation by convection,
said first optical element (1) being configured for modifying the trajectory of the light emitted by the at least one light emitting diode (4).

2. Device according to claim 1, where the lenses (9, 9') have a substantially rectangular section base.

3. Device according to claim 1, further comprising a heat distributing (6) element.

* * * * *

UNITED STATES PATENT AND TRADEMARK OFFICE
CERTIFICATE OF CORRECTION

PATENT NO. : 8,704,259 B2  Page 1 of 1
APPLICATION NO. : 13/497808
DATED : April 22, 2014
INVENTOR(S) : Beneitez et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 135 days.

Signed and Sealed this
Twenty-ninth Day of September, 2015

Michelle K. Lee
*Director of the United States Patent and Trademark Office*